(12) United States Patent
Huang et al.

(10) Patent No.: US 9,548,755 B2
(45) Date of Patent: Jan. 17, 2017

(54) ANALOG-TO-DIGITAL CONVERTER WITH REDUNDANCY FOR IMAGE SENSOR READOUT

(71) Applicant: Forza Silicon Corporation, Pasadena, CA (US)

(72) Inventors: Steven Huang, Pasadena, CA (US); Ali Mesgarani, Pasadena, CA (US); Daniel Van Blerkom, Altadena, CA (US)

(73) Assignee: FORZA SILICON CORPORATION, Pasadena, CA (US)

( * ) Notice: Subject to any disclaimer, the term of this patent is extended or adjusted under 35 U.S.C. 154(b) by 26 days.

(21) Appl. No.: 14/323,998

(22) Filed: Jul. 3, 2014

(65) Prior Publication Data

US 2015/0008308 A1    Jan. 8, 2015

(51) Int. Cl.
*H03M 1/14* (2006.01)
*H03M 1/08* (2006.01)
*H03M 1/12* (2006.01)
*H03M 1/46* (2006.01)
*H03M 1/56* (2006.01)

(52) U.S. Cl.
CPC ............. *H03M 1/14* (2013.01); *H03M 1/0863* (2013.01); *H03M 1/123* (2013.01); *H03M 1/145* (2013.01); *H03M 1/466* (2013.01); *H03M 1/56* (2013.01)

(58) Field of Classification Search
CPC ....... H04N 5/37455; H03M 1/14; H03M 3/46; H01L 27/14641
USPC ....... 250/208.1, 214 R, 214.1; 348/241–243, 348/294–311; 257/290–292, 440–444
See application file for complete search history.

(56) References Cited

U.S. PATENT DOCUMENTS 7,948,533 B2 *   5/2011   Koseki ................. H04N 5/3658
                                                                  348/222.1

\* cited by examiner

*Primary Examiner* — Que T Le
(74) *Attorney, Agent, or Firm* — David V. Rossi; Frommer Lawrence & Haug LLP (57) ABSTRACT

Methods and systems for analog-to-digital conversion applicable to an image sensor, such as a CMOS image sensor, in which an ADC comprises built-in redundancy such that the ADC can start its conversion cycle before the ADC input settles to a desired resolution and the ADC can yet accurately convert the ADC input to a digital value with the desired resolution. In a CMOS image sensor, such an ADC configuration enables the pixel readout time to overlap with the ADC conversion time, reducing the total time needed to convert the pixel signal value to a digital value with the desired resolution.

17 Claims, 5 Drawing Sheets

ANALOG-TO-DIGITAL CONVERTER WITH REDUNDANCY FOR IMAGE SENSOR READOUT

RELATED APPLICATIONS

This application claims the benefit of U.S. Provisional Application No. 61/842,623, filed Jul. 3, 2013, which is hereby incorporated herein by reference in its entirety.

BACKGROUND

The present disclosure relates to analog-to-digital conversion and, more particularly, to analog-to-digital conversion (ADC) methods and systems that are well suited for use in an image sensor, such as a CMOS image sensor.

ADC conversion typically requires the input signal to settle to a certain percentage of its final value before it can start the conversion cycle. This settling percentage is usually about one-half (½) of the final ADC bit resolution.

As image sensor size grows larger, the amount of time it takes for the pixel to drive its output load is increasing. This settling time is therefore limiting the speed of the overall image sensor frame rate.

SUMMARY OF SOME EMBODIMENTS

In accordance with some embodiments of the present disclosure, an ADC comprises built-in redundancy such that the ADC can start its conversion cycle before the ADC input settles to a desired resolution and the ADC can yet accurately convert the ADC input to a digital value with the desired resolution. In a CMOS image sensor, such an ADC configuration enables the pixel readout time to overlap with the ADC conversion time, thus reducing the total time needed to convert the pixel signal value to a digital value with the desired resolution.

Some illustrative ADC embodiments according to the present disclosure implement a sub-ranging approach; for example, using successive approximation register (SAR) ADC conversion as the first step and a single-slope RAMP ADC with overlap range as the second step.

In accordance with another illustrative embodiment, a SAR ADC includes one or more redundant error correction capacitors to compensate for the input settling error.

In this respect, for example, it may also be understood that built-in redundancy may correspond to built-in error correction; as such, in accordance with some embodiments of the present disclosure, an ADC comprises built-in error correction such that the ADC can start its conversion cycle before the ADC input settles to a desired resolution.

In accordance with some embodiments of the present disclosure, an ADC, such as a SAR ADC, is configured to include redundancy in the conversion process to compensate for incomplete settling of the analog input voltage (e.g., pixel output voltage in an image sensor implementations) during the conversion cycle.

It will also be understood that in various embodiments, such redundancy in an ADC may be provided by other configurations, such as a sub-radix 2 architecture, or pipeline ADC's with overlap regions between pipeline stages.

Some embodiments of the present disclosure comprise an image sensor, such as a CMOS image sensor, that includes an ADC having built-in redundancy, such as an ADC according to any of the embodiments disclosed herein.

It will be appreciated by those skilled in the art that the foregoing brief description and the following detailed description are exemplary (i.e., illustrative) and explanatory of embodiments of the present invention, but are not intended to be restrictive of the present invention or limiting of the advantages which can be achieved by the present invention in various implementations. Additionally, it is understood that the foregoing summary and ensuing detailed description are representative of some embodiments of the invention, and are neither representative nor inclusive of all subject matter and embodiments within the scope of the present invention. Thus, the accompanying drawings, referred to herein and constituting a part hereof, illustrate embodiments of this invention, and, together with the detailed description, serve to explain principles of embodiments of the invention.

BRIEF DESCRIPTION OF THE DRAWINGS

Aspects, features, and advantages of some embodiments of the invention, both as to structure and operation, will be understood and will become more readily apparent in view of the following description of non-limiting and non-exclusive embodiments in conjunction with the accompanying drawings, in which like reference numerals designate the same or similar parts throughout the various figures, and wherein.

DESCRIPTION OF SOME EMBODIMENTS

Throughout the description and claims, the following terms take at least the meanings explicitly associated herein, unless the context dictates otherwise. The meanings identified below do not necessarily limit the terms, but merely provide illustrative examples for the terms. The phrase "an embodiment" as used herein does not necessarily refer to the same embodiment, though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

In addition, as used herein, unless the context clearly dictates otherwise, the term "coupled" refers to directly connected to or to indirectly connected through one or more intermediate components and, in some contexts, may also denote or include electrically coupled, such as conductively coupled, capacitively coupled, and/or inductively coupled. Further, "conductively coupled" refers to being coupled via one or more intermediate components that permit energy transfer via conduction current, which is capable of including direct current as well as alternating current, while "capacitively coupled" refers to being electrostatically coupled through one or more dielectric media, and possibly also via one or more intervening conductors (e.g., via a series of capacitive components), that permit energy transfer via displacement current and not via direct current. Those skilled in the art will further understand that elements may be capacitively coupled intentionally or unintentionally (e.g., parasitically) and that in some contexts, elements said to be capacitively coupled may refer to intentional capacitive coupling. In addition, those skilled in the art will also understand that in some contexts the term "coupled" may refer to operative coupling, through direct and/or indirect connection. For instance, a conductor (e.g., control line) said to be coupled to the gate of a transistor may refer to the conductor being operable to control the gate potential so as to control the operation of the transistor (e.g., switching the transistor between "on" and "off" states), regardless of whether the conductor is connected to the gate indirectly (e.g., via another transistor, etc.) and/or directly.

As used herein, the terms "pixel" and "pixel circuit" in the context of an image-sensor pixel array refer to a picture element unit cell containing a photosensor and associated circuitry for converting photons incident on the photosensor into an electrical signal and coupling the electrical signal to circuitry external to the pixel array for discerning the photons detected by the photosensor. It is further noted, that the terms "reset," "resetting" (or variations thereof) will be understood by those skilled in the art according to context. For example, in some contexts such terms may refer to resetting the potential of a pixel's photo-charge integration/accumulation region (e.g., within a photodiode) so as to, for example, initiate an integration period. Also by way of example, in some contexts involving pixels having floating diffusion regions, such terms may refer to resetting the potential of a pixel's floating diffusion region, without necessarily also concurrently resetting the pixel's photo-charge integration/accumulation region.

While the ensuing embodiments are generally set forth in the context of image sensor applications, those skilled in the art will understand that an ADC in accordance with the present disclosure is not limited to image sensor implementations.

Briefly, as will be further understood in view of the ensuing disclosure, illustrative embodiments of the present disclosure comprise an ADC that includes redundancy in the conversion process to compensate for incomplete settling of the pixel output voltage during the conversion cycle (i.e., the incomplete settling during the conversion cycle being associated with the conversion cycle beginning prior to the pixel output voltage settling to within a desired resolution). In other words, to reduce the time needed to convert the pixel value, some illustrative ADC embodiments according to the present disclosure are configured to include redundancy such that the ADC conversion can start before the pixel settles to its desired resolution and the redundancy can compensate for the incomplete settling of the pixel output voltage during the ADC conversion. Such compensation thus provides for accurate ADC conversion with the desired resolution despite beginning the conversion prior to the input signal (e.g., pixel signal) settling to within the desired resolution. In accordance with some embodiments, the amount of redundancy may dictate how early the conversion process can be started prior to the pixel signal settling, and the amount of redundancy may be designed to reduce the overall conversion time of the pixel signal during readout.

Accordingly, an ADC in accordance with the some embodiments of the present disclosure in which conversion may start prior to the pixel settling to a desired resolution provides for reduced conversion time compared to, for example, the corresponding ADC being operated to start conversion when the pixel settles to the desired resolution.

Figure 1:
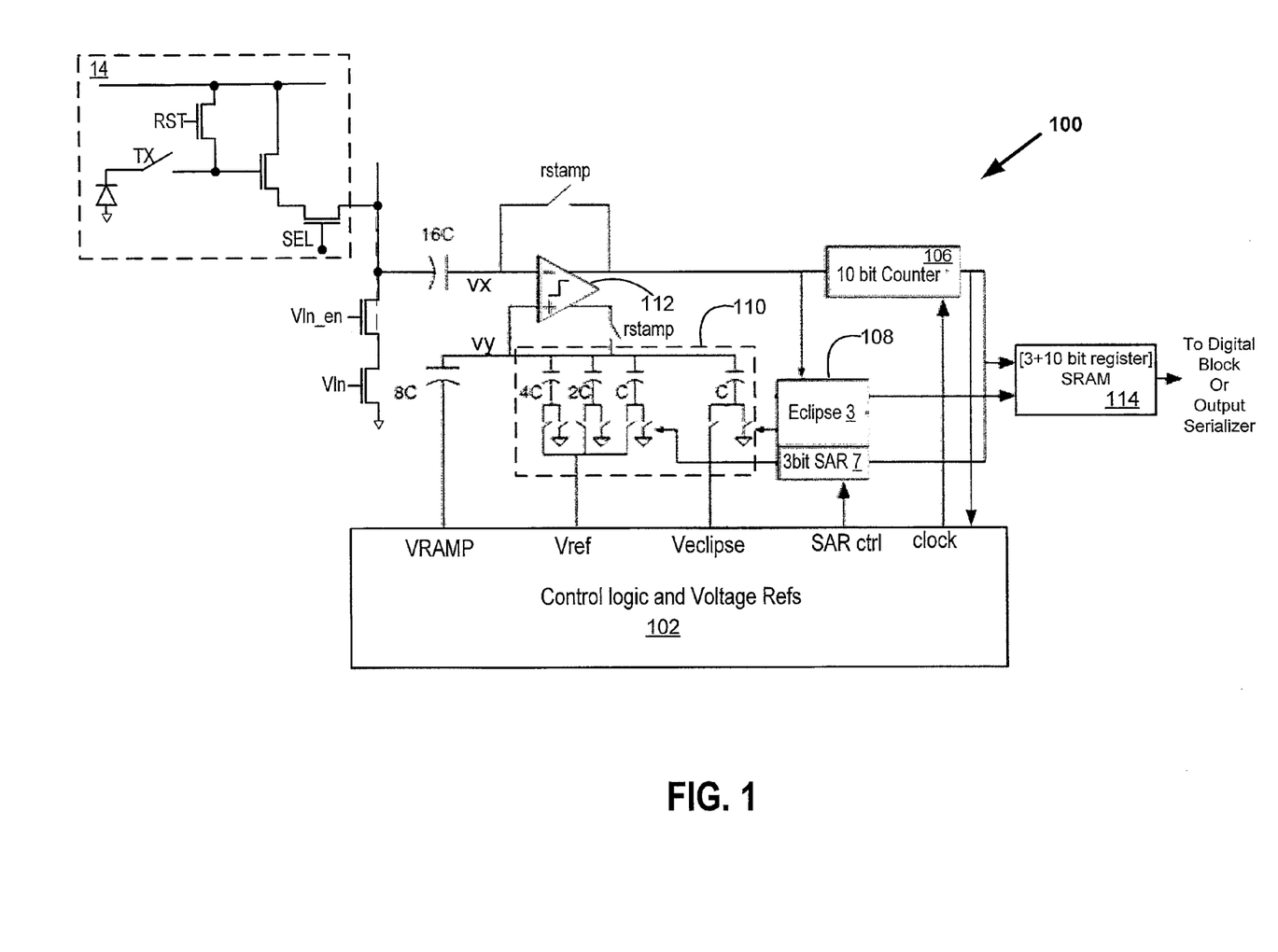
FIG. 1 shows a schematic block diagram of an illustrative hybrid ADC architecture that may be implemented in the readout chain of a CMOS image sensor to provide a two-step conversion, in accordance with some embodiments of the present disclosure.

FIG. 1 shows a schematic block diagram of an illustrative hybrid, two-step sub-ranging ADC architecture that may be implemented in the readout chain of a CMOS image sensor, in accordance with some embodiments of the present disclosure. Briefly, in this implementation, the ADC conversion begins with a 3-bit successive-approximation-register (SAR) ADC that performs a Coarse conversion, which is followed by a Fine conversion performed with a 10-bit RAMP ADC, of which the most significant bit overlaps with the least significant bit of the Coarse conversion, the hybrid ADC thereby generating an 13-bit digital output for providing a 12-bit resolution of the analog signal. The Coarse conversion starts right after the pixel settles to within the overlap region of the Fine conversion. In this illustrative embodiment, the RAMP ADC achieves the over-range correction by starting halfway between the previous Coarse range and halfway after the next Coarse range. Therefore, the pixel needs only to settle to within half a Coarse range before the ADC (i.e., the SAR ADC portion) can start its conversion.

It will be understood, however, that this embodiment is merely illustrative and subject to many variations. For example, in various embodiments coarse conversion may be configured to provide a different number of most-significant bits (and, similarly, fine conversion may be configured to provide a different number of least-significant bits). In addition, the Coarse and Fine conversion operations may be implemented using any combination of myriad ADC configurations. For instance, the Coarse conversion can be implemented as any type of ADC circuitry, such as Flash, SAR, Single Slope, or Cyclic ADC circuitry. Similarly, the Fine conversion can be implemented as any type of ADC circuitry, such as Flash, SAR, Single Slope, or Cyclic ADC circuitry. In view of the present disclosure, those skilled in the art will understand the design issues and considerations (e.g., advantages, disadvantages, tradeoffs, such as with respect to speed, power, noise, chip real estate, etc.) in using various types of ADCs for implementing two-step analog-to-digital conversion in accordance with some embodiments of the present invention.

More specifically, as shown in FIG. 1, hybrid ADC 100, which is shown coupled to a pixel 14 (shown, by way of example, as a 4T pixel) of an image sensor pixel array, comprises a comparator 112 with its inverting input coupled to pixel 14, a binary weighted capacitor bank 110, output storage (e.g., memory/latches) implemented as SRAM 114 (comprising a register for storing 3 coarse and 10 fine bits), a 10 bit counter 106 (used for RAMP ADC), SAR registers and switch control logic 108, and control logic and voltage reference circuitry 102 (e.g., which includes a ramp generator for selectively coupling a single-slope ramp signal Vramp to the non-inverting input of comparator 112).

As shown, SAR registers and switch control logic 108, which receives the output from comparator 112, includes Eclipse register 3, and 3 bit SAR register 7, which are operable in controlling switch states of capacitor bank 110. Control logic and Voltage Refs circuitry 102 provides the overall control and reference signals (e.g., voltage references) to operate hybrid ADC 100 as a SAR ADC and as a RAMP ADC to provide a two-step conversion with a coarse SAR ADC conversion followed by a fine RAMP ADC conversion, as further described below.

As shown, the "top" plates of capacitor bank 110 are coupled to an analog non-inverting input of comparator 112, and the voltage signal on that input is represented as signal vy, while the voltage signal on the analog inverting input of comparator 112 is represented as signal vx. In this embodiment, the "bottom" plates of each of the 3-bit resolving capacitors of capacitor bank 112 are selectively switchable between voltage references Vref and ground potential. Capacitor bank 110 also includes another capacitor that is selectively switchable between two voltages: Veclipse, and ground potential. Simply by way of non-limiting example, in some implementations, the value of capacitance C may be about 6 femto-Farads (IF). Two reset switches rstamp are configured for selectively resetting the comparator 112 and may be used for auto-zeroing to eliminate offset (for ease of reference, a switch and its control signal may be identified herein by a common reference character; as such, two reset switches (e.g., reset switches rstamp) driven by the same control signal ("rstamp") may be referred to by the same reference character).

As noted, in this illustrative embodiment, pixel 14 is coupled to the inverting input of comparator 112. By way of non-limiting example, for purposes of clarity of exposition, in this illustrative embodiment pixel 14 may be configured to provide a maximum peak-to-peak voltage signal of 0.6 V (corresponding to full-well capacity). As noted, pixel 14 is depicted, by way of example, as a 4T pixel, including a reset transistor RST, a transfer gate TX (illustrated as a simple switch element), and a select (e.g., row select) transistor SEL. Readout of the pixel, including intra-pixel transfer of photocarriers to the pixel's floating diffusion and providing a corresponding voltage signal on a column bus via the source follower transistor being coupled to source follower load transistor (with gate potential Vln) via select transistor SEL and column select transitor/signal Vln_en, is well known to those skilled in the art and, for clarity, is further described below with reference to FIG. 5. The precise configuration or implementation of pixel 14 is not important; e.g., in various embodiments, the pixel can be of myriad types including, for example, CTIA, Buffered direct injection (BDI), Direct injection, etc.

It will be understood by those skilled in the art that the functional block diagram of FIG. 1 is merely illustrative, and that ADC 100 may be implemented in myriad ways according to various designs that may combine and/or partition functionality and/or physical components (such as those represented in FIG. 1) in myriad ways, in accordance with embodiments of the present invention. Simply by way of example, logic 108 may be logically and/or physically included within control logic and voltage refs 102; representing these as separate blocks does not necessarily require that they are logically and/or physically separate and/or only communicate via SAR ctrl signal. In addition, those skilled in the art will understand that for ease of reference and clarity of exposition, FIG. 1 does not show all components (e.g., sample-hold circuitry, programmable gain amplifiers, other analog signal chain components, additional latches, signaling interfaces to other image sensor and external control components, etc.) that those skilled in the art may employ in implementing the depicted illustrative embodiment or various other embodiments of the present invention.

Figure 2:
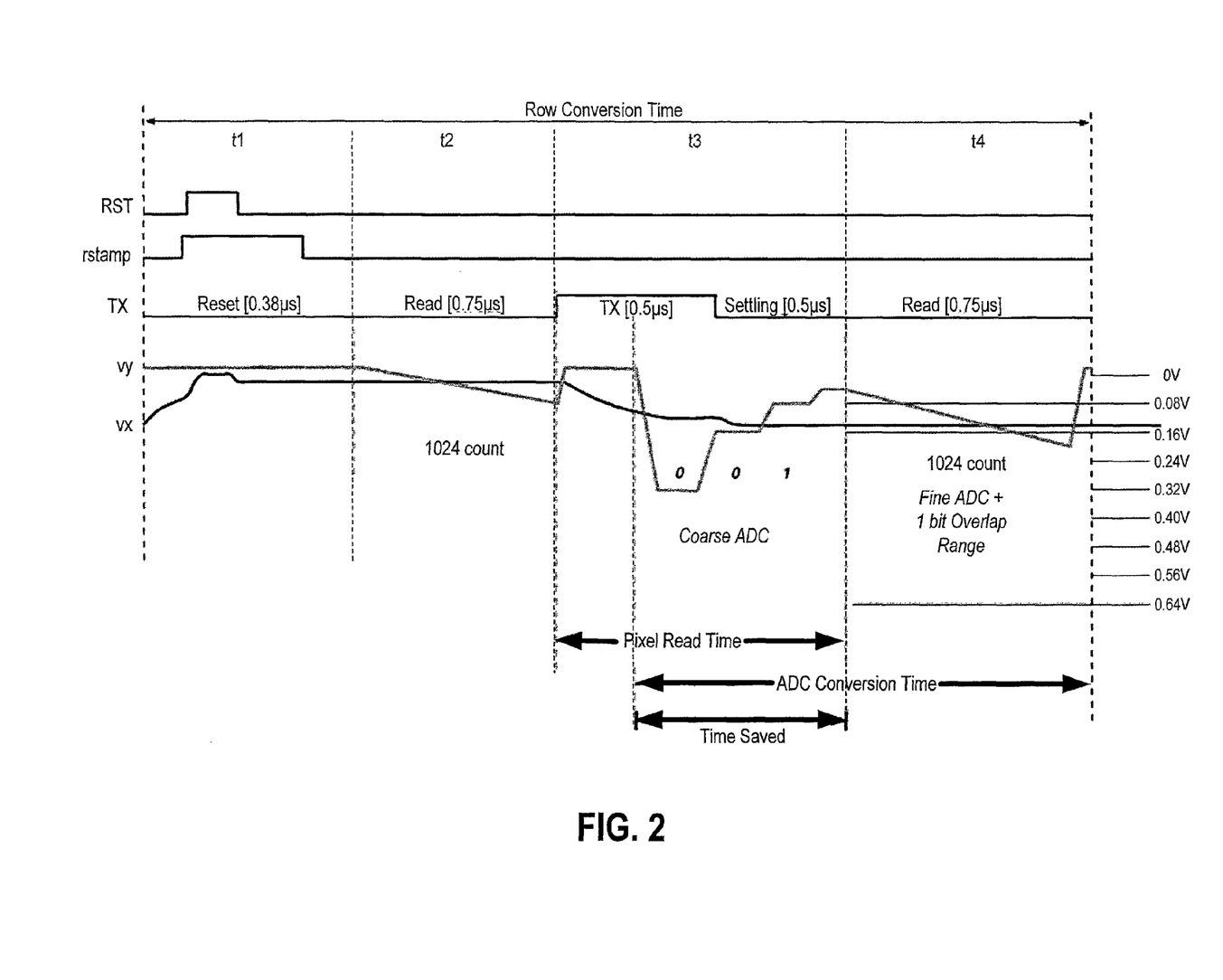
FIG. 2 shows an illustrative simplified timing diagram corresponding to operation of the ADC architecture of FIG. 1, in accordance with some embodiments.

FIG. 2 shows an illustrative simplified timing diagram corresponding to operation of the ADC architecture of FIG. 1, where the conversion cycle may begin before the pixel signal settles to a level within the final ADC bit resolution (e.g., before the pixel signal settles to within about one-half (½) of the final ADC bit resolution), and where, more particularly, in this illustrative embodiment, the conversion cycle can start while the TX transfer gate is still on. By way of non-limiting example, in accordance with some implementations of the illustrative embodiment, it would typically take about 0.5 μsec for complete pixel charge transfer to complete and about another 0.5 to 1 μsec for the pixel output to settle to 12-bit resolution. In this example, the ADC starts while the pixel is still settling, therefore reducing the time needed for the complete conversion cycle.

More specifically, FIG. 2 shows an illustrative simplified timing diagram corresponding to operation of the ADC architecture of FIG. 1, where the conversion is split into two separate conversions, namely, a Coarse conversion that begins before the pixel signal has settled to a level within the resolution of the ADC, and a Fine conversion that follows the coarse conversion. As shown, in this illustrative embodiment, the Coarse conversion begins not only before such settling, but also while the pixel signal is being read out (e.g., while the transfer gate TX, row/pixel select transistor SEL, and column select transistor are all asserted/enabled and the charge integrated/accumulated in the pinned photodiode is being transferred to the floating diffusion of the illustrative 4T pixel). It is noted that for clarity of exposition, by way of non-limiting example time periods for various operations are identified in brackets (e.g., the coarse conversion time period is shown as about 0.75 μs; the first reset operation time period is shown as 0.38 μs, etc.); neither absolute or relative times should be considered as being limited by such illustrative time periods.

After pixel 14 has been reset and integrating charge for a given period of time, it is selected for readout. More specifically, during time interval t1, a reset signal RST is applied to reset the pixel's output charge collection node (e.g., a floating diffusion). Accordingly, voltage vx is shown as being pulled-up, reflecting the pixel charge collection node charging to the reset potential. Also during t1, the comparator is reset by applying reset signal rstamp.

The illustrative embodiment provides for eclipsing distortion detection. While not shown in FIG. 2, eclipsing distortion detection may be implemented during the end of interval t1, with signal vx equal to the reset voltage, DAC capacitor bank 110 may be controlled to provide an eclipse reference voltage (Veclipse) as signal vy, for comparison with the reset level. If the reset voltage level is greater than Veclipse (i.e., vx>vy), then conversion operation continues. It will be understood by those skilled in the art that in various embodiments, different actions can be taken if eclipsing is detected. For example, anti-eclipsing circuitry can be invoked. Alternatively, a flag indicative of the pixel eclipsing may be written into SRAM 114.

During interval t2, hybrid ADC 100 is controlled to operate as a RAMP ADC, with a ramp generator (e.g., embodied in control logic and voltage reference circuitry 102, and driven based on counter 106) coupling a ramp voltage signal VRAMP to drive voltage vy to provide for converting the pixel reset signal to a 10-bit digital value that may be used for purposes of correlated double-sampling (CDS).

Then, during interval t3 a transfer signal TX applied to the pixel 14 causes readout of a signal representing the integrated photocharge. As such, voltage signal vx is shown decreasing while TX is asserted. In this illustrative embodiment, interval t6 includes a settling period following the readout interval.

More specifically, after a time delay (e.g., predetermined and/or programmable based on design and/or calibration) from the assertion of TX at the beginning of read interval t3, and while TX is still asserted (and the pixel signal is still being read out and has not yet settled to within the ADC resolution), the coarse conversion begins. As shown, during interval t3, ADC 100 is operated as a SAR ADC to sequentially resolve three bits according to controlling the capacitor bank to switch the binary-scaled capacitors, one capacitor at a time, between the two reference levels, in the typical successive approximation timing, to provide charge redistribution according to the comparison between vx and vy. As shown, in this example, coarse ADC resolves the coarse bits as 001 (i.e., MSB=0, [MSB-1]=0, [MSB-2]=1). The coarse bits are stored (e.g., in circuitry 108 and/or in SRAM 114) for subsequent use.

As shown, near or at the end of interval t3 and continuing into t4, hybrid ADC 100 is controlled to operate as a RAMP ADC, by coupling a ramp voltage signal VRAMP to drive voltage vy to provide a fine comparison, resolving the signal to 10 bits, including one redundant bit (i.e., the most significant bit of the fine bits, corresponding to the least significant bit of the coarse bits). As understood by those skilled in the art, gain may be achieved by changing the slope of the RAMP and the voltage on Vref during actual pixel readout conversion. As understood by those skilled in the art, in some embodiments, prior to applying the RAMP ADC for the fine conversion, the 10-bit digital value for the pixel reset signal determined in interval t2 may be applied to adjust the count value of counter 106 such that correlated double sampling is effected for the fine conversion of the pixel read.

With the fine conversion complete, the fine bits may then also be written to SRAM 114 for the pixel. The 13 bits generated by the two-step coarse and fine conversion may be subsequently provided for processing (e.g., via output serializer or digital block) to provide an actual pixel value represented with 12 bit resolution.

As may be appreciated, and as illustrated in FIG. 2, an illustrative feature that may be associated with ADC in accordance with the illustrative embodiment represented by FIGS. 1 and 2 is that by performing a coarse conversion before the pixel read has settled to within the full resolution of the ADC (e.g., performing the coarse conversion while the photocharge is being transferred to the floating diffusion, in this embodiment), the overall conversion time of the pixel read is reduced compared to performing the entire conversion after the pixel read has settled to within the full ADC resolution.

Figure 3:
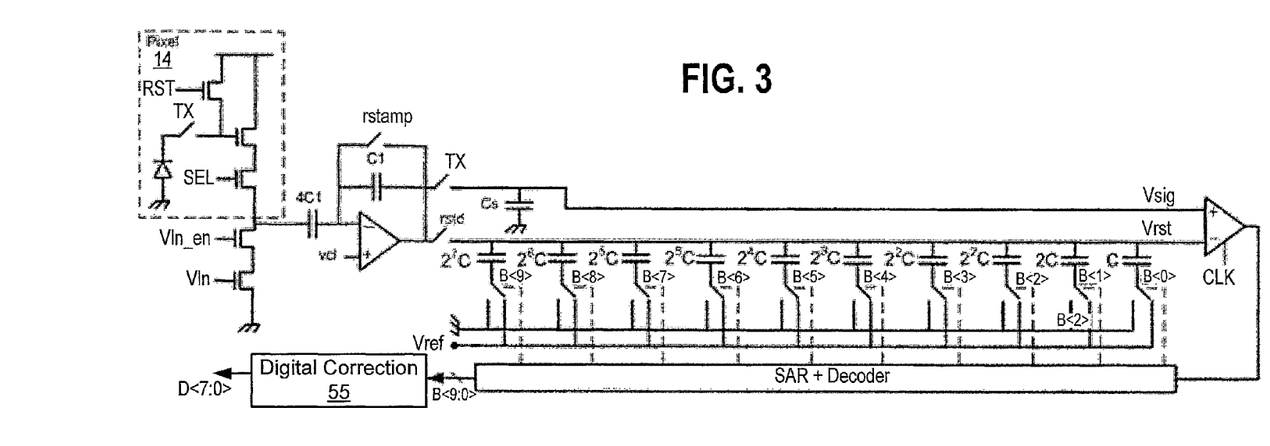
FIG. 3 shows a schematic block diagram of an illustrative redundant SAR ADC architecture that may be implemented in the readout chain of a CMOS image sensor, in accordance with some embodiments of the present disclosure.

FIG. 3 shows a block diagram of an illustrative redundant error correction SAR ADC that may be implemented in the readout chain of a CMOS image sensor, in accordance with some embodiments of the present disclosure. This illustrative SAR ADC embodiment includes extra capacitors in the DAC that are used to compensate for incomplete signal settling, such that the ADC conversion can start before the pixel settles to its desired resolution and the redundancy can compensate for the incomplete settling of the pixel output voltage during the ADC conversion.

More specifically, in the illustrative architecture shown in FIG. 3, an 8 bit redundant SAR is shown, where, by way of example, redundant DAC capacitors are used in 6th and 3rd bits. Accordingly, the capacitor bank includes a total of 10 capacitors that are switched to sequentially resolve 10 bit values B<9:0> that are provided to digital correction circuitry 55 to provide the corrected 8-bit digital value D<7:0> according to the following conversion:

$$D=2^7B<9>+2^6B<8>+2^5B<7>+2^5(<B6>-0.5)+\\2^4B<5>+2^3B<4>>+2^2B<3>+2^2(B<2>-0.5)+\\2B<1>+B<0>.$$

It will be understood, however, that various alternative embodiments may be implemented with a different number of bits (i.e., more or less than 8-bits), and that regardless of the number of bits, capacitor redundancy is neither limited to being two in number (e.g., only one redundant capacitor; three or more redundant capacitors) nor limited to being provided for the $6^{th}$ and $3^{rd}$ bits (e.g., any one or combination of bits may have redundant capacitors, depending on the implementation). Operation and design of such a redundant SAR ADC may be further understood with reference to, for example, U.S. Pat. No. 7,724,174 to Chang et al., and Chun-Cheng Liu, et al., "A 10b 100 MS/s 1.13 mW SAR ADC with Binary-Scaled Error Compensation," 2010 IEEE ISSCC Dig. Tech. Papers, pp. 386-389, each of which is hereby incorporated herein by reference in its entirety.

Figure 4:
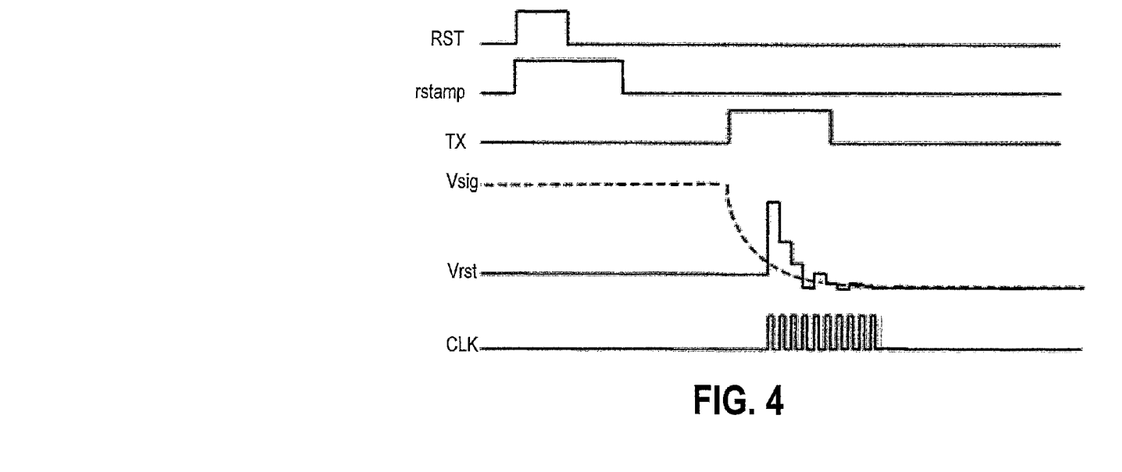
FIG. 4 shows an illustrative simplified timing diagram corresponding to operation of the redundant SAR ADC architecture of FIG. 3, in accordance with some embodiments.

As may be understood from FIG. 4, which is an illustrative simplified timing diagram corresponding to operation of the ADC architecture of FIG. 3, in operation of the illustrative SAR DAC with redundant $6^{th}$ and $3^{rd}$ bit DAC capacitors, after the programmable gain amplifier (PGA) reset switch is turned off, the reset voltage is sampled on the top plate of charge redistribution DAC. The A/D conversion starts shortly after the TX transfer gate turns on (and before the pixel signal has settled to within the full resolution of the ADC). Since the signal level has not yet settled to its final value when the conversion starts, in this example the ADC makes a wrong decision in its first conversion step. In a regular SAR ADC without redundancy, such error cannot be corrected, even if all the remaining conversions are correct, since the difference between the input and the DAC will remain higher than 1 LSB. But in the illustrative embodiment of a SAR ADC architecture having capacitor redundancy, the redundant 6th bit of the DAC allows bringing the DAC output back to the signal range. And in this example, when the TX turns off, the charge injection by the switch gives rise to another error in the DAC output. The redundant 3rd bit of the DAC allows correcting for this error in the same manner as the redundant $6^{th}$ bit capacitor provides for correction. As will be understood in view of this illustrative embodiment, more redundancy may be used if it is desired to start A/D conversion earlier.

And, as may be appreciated, although the redundant capacitors result in additional clock cycles (corresponding to comparisons), this redundancy allows for beginning the conversion sufficiently early such that the time needed for the conversion is reduced compared to performing the entire conversion (i.e., generating all N-bits) after the pixel signal has settled to within the full resolution of the ADC.

Figure 5:
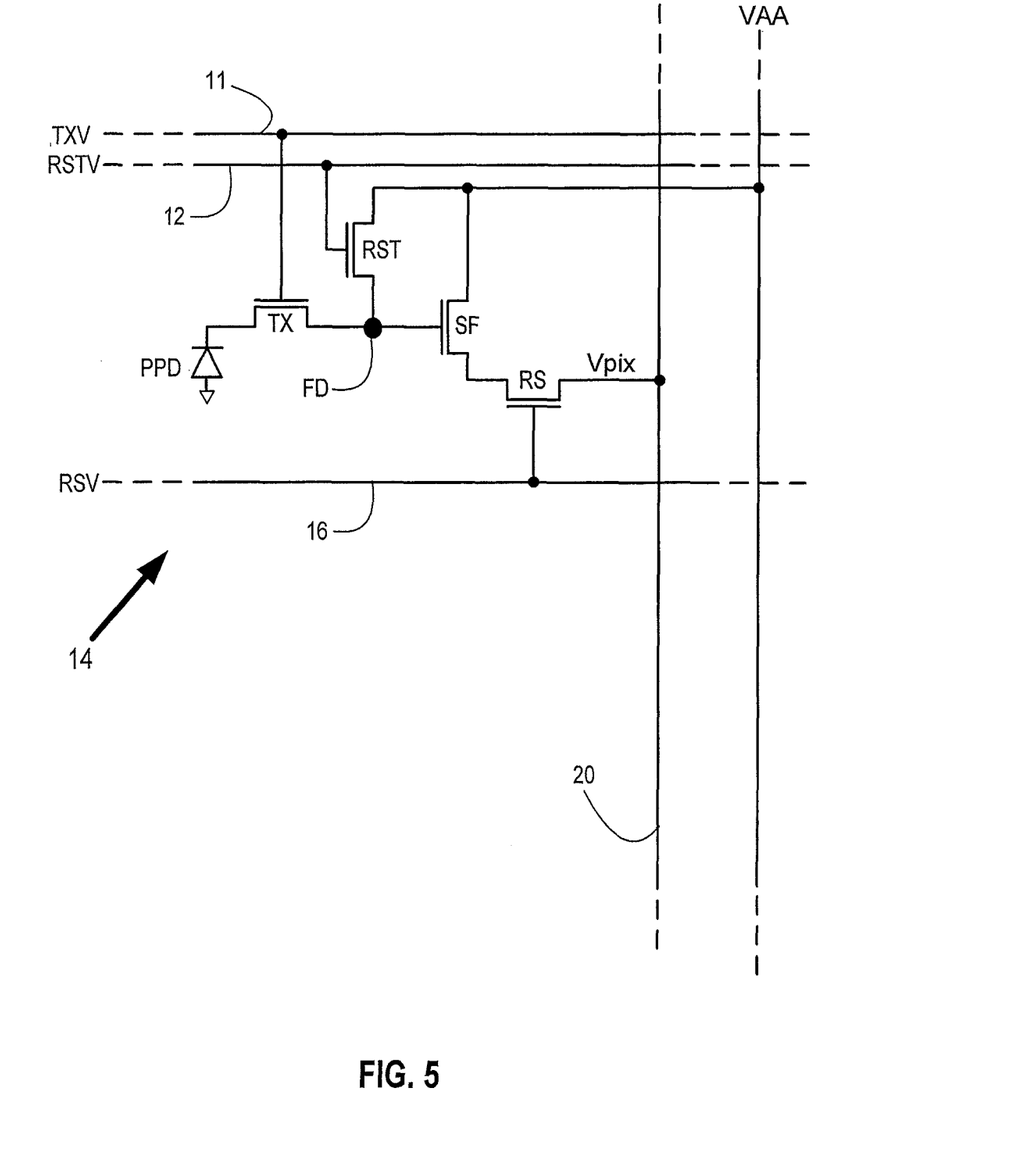
FIG. 5 schematically depicts an illustrative pixel circuit, in accordance with some embodiments.

FIG. 5 schematically depicts a pixel circuit 14, which in this illustrative embodiment is shown as a 4T type pixel circuit that includes a photosensor (configured, in this embodiment, as a pinned photodiode) PPD, and a transfer transistor TX controlled by transfer signals TXV (e.g., TX in FIG. 1) applied to transfer control lines 11 that is coupled to the gate of transfer transistors TX. The pixel also comprises a readout circuit that includes a charge storage region configured as floating diffusion region FD, a source follower transistor SF, a row-select transistor RS controlled by a row select signal RSV (e.g., SEL in FIG. 1) applied to row select control line 16 that is coupled to the gate of row-select transistor RS, and a reset transistor RST controlled by a reset signal RSTV (e.g., RST in FIG. 1) applied to reset control line 12 that is coupled to the gate of reset transistor RST.

Photosensor PPD, shown as connected between a potential Vss (e.g., substrate potential, which may be at ground) and the transfer transistor TX, is conductively coupled to the floating diffusion region FD when the transfer transistors TX is activated by transfer control signals TXV. Thus, photo-carriers (e.g., electrons) generated by photosensor PPD may be selectively transferred to the floating diffusion region FD in response to the transfer control signals TXV.

As illustrated, the collection or floating diffusion region FD is electrically connected to the gate of a source follower transistor SF, the output of which is selectively applied to the column line 20 by row select transistor RS as pixel voltage Vpix. The reset transistor RST selectively resets the collection or floating diffusion region FD to a predetermined voltage by coupling a voltage VAA to the collection or floating diffusion region FD during a reset period which precedes or follows a charge accumulation or integration period.

The source follower transistor SF is connected between the array pixel supply voltage VAA and the row select transistor RS, and converts the charge stored at the floating diffusion region FD into an electrical output signal.

The row select transistor RS is controllable via row select line 16 by row select signal RSV for selectively outputting the electrical output signal from the source follower transistor SF onto column line (e.g., bus) 20, which is coupled to readout circuitry (not shown in FIG. 3) that is disposed external to the pixel array and may include, for example, a current sink load transistor, and sample and hold circuitry for each column bus. As understood by those skilled in the art, such sample and hold circuitry which may be provided for each column bus is typically configured for sampling the reset level as well as the signal level (e.g., in order to provide for correlated-double-sampling CDS). That is, in connection with readout of a pixel, two output signals may be generated, one being a reset signal generated after the floating diffusion region is reset, the other being a signal level representing an image or photo signal generated after charge is transferred from the photosensor(s) to the floating diffusion region. The reset level and signal level output signals may be selectively stored in the sample and hold circuit based on respective reset select and signal select signals applied to the sample and hold circuitry.

In operation, a row select transistor RS is activated by row select signal RSV on line 16 and connects the imager pixel 14 to a column line 20. A reset transistor RST is typically turned on by a reset signal RSTV on line 12 and the floating diffusion region FD is reset to a predetermined voltage (eg., VAA). Integration of incident photons and accumulation in PD of photo-electrons generated from the photons is conducted at least during the reset period and prior to the application of a transfer gate voltage signal TX. The transfer gate voltage signal TXV applied on line 11 to transfer gate TX is then clocked ON to cause the accumulated charge in the PPD to transfer to the floating diffusion region FD, which functions as a charge collection region.

Figure 6:
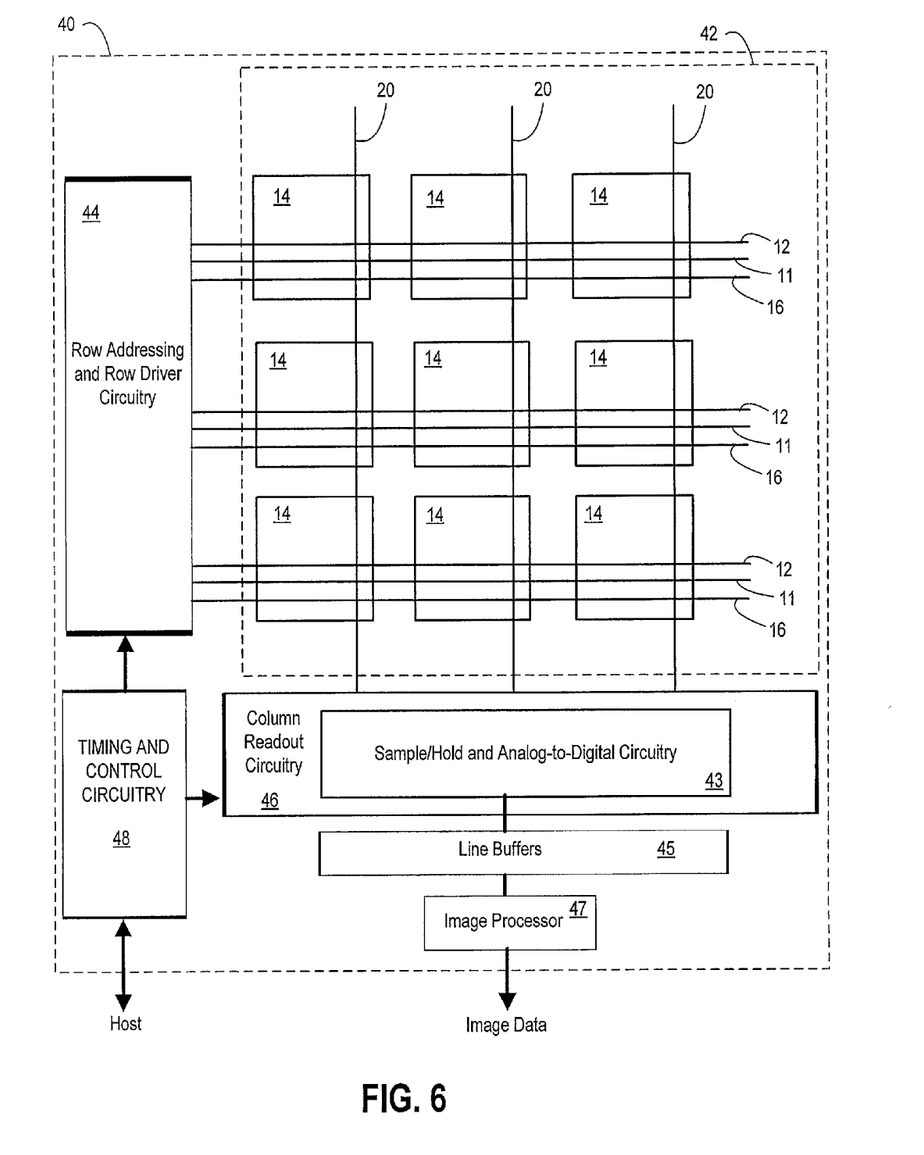
FIG. 6 depicts a block diagram of an illustrative CMOS image sensor architecture that may be used to implement embodiments in accordance with the present disclosure, in accordance with some embodiments.

FIG. 6 depicts a block diagram of an illustrative CMOS image sensor 40 architecture that may be used to implement embodiments in accordance with the present disclosure, such as embodiments employing a ADCs according to the embodiments of FIGS. 1-4, As well known, pixel array 42 typically includes a large number of pixels arranged in an M×N array; however, CMOS image sensor 40 is shown as including a simplified pixel array 42 comprising a three by three array of pixels 14, which, for ease of discussion, is a 4T pixel circuit in this embodiment (e.g., as per FIGS. 1,3, and 5), but may be any of a variety of pixel circuit types.

Row Addressing and Row Driver Circuitry 44 generates transfer gate control signals on lines 11, row select signals on lines 16, an reset gate control signals on lines 12. Column Readout Circuitry 46 includes analog to digital circuitry 43 for sampling and digitizing output values readout from the pixel array 42. Particularly, circuitry 43 may be implemented to comprise a plurality of A/D converters configured to implement column parallel readout, and each of the A/D converters may be implemented to provide two-step/hybrid or redundant SAR conversion in accordance with embodiments of the present invention, such as the illustrative embodiments described with reference to FIGS. 1 through 4. In some embodiments, the circuitry 43 may be configured such that the readout circuitry associated with each column bus 20 may have a respective analog to digital converter (ADC), though in some embodiments pairs of columns may share an ADC.

Timing and control circuitry 48 controls both the row addressing and row driver circuitry 44 and the column readout circuitry 43. For instance, timing and control circuitry controls the row addressing and row driver circuitry 44 for selecting the appropriate row for readout, and may, for example, provide timing control signals in accordance with rolling shutter readout or global shutter readout. As indicated in FIG. 4, timing and control circuitry 48 may also communicably interface with a host (e.g., a processor associated with a system comprising the image sensor), which may, for example, in some implementations, specify various control information.

As schematically depicted, signals on column buses 20 are sampled and digitized by circuitry 43, and the digitized pixel values provided by the ADCs may be provided to line buffers 45, which may be used to temporarily store digital signals from circuitry 43 for use by image processor 47. In general, any number of line buffers 45 may be included and, for example, each line buffer may be capable of storing digital signals representative of the charge signals that may be read from each pixel in a given row of pixels in the pixel array 42. Image processor 47 may be used to process the digital signals held in line buffers 36 to produce output image data that may be provided to a device external to the image sensor 40.

As may be appreciated, there are many possible alternative implementations of an image sensor architecture that may embody ADC in accordance with some embodiments of the present disclosure, such as a two-step readout architecture providing a coarse conversion prior to pixel signal settling followed by a fine conversion upon settling, in accordance with some embodiments as, for example, described hereinabove in connection with FIGS. 1 and 2, and/or such as a redundant SAR ADC architecture in accordance with some embodiments such as described in connection with FIGS. 3 and 4. By way of example, it will be understood that circuitry 46 may be divided into two portions provided at the top and bottom of the pixels array.

It will be understood from the foregoing, that myriad variations and additional or alternative embodiments may be implemented without departing from the scope of the present disclosure. For example, by way of non-limiting, illustrative example, it will be understood that various embodiments of the present invention include, but are not limited to, any Multi-step ADC that does a Coarse conversion during a pixel read followed by a Fine Conversion on the pixel read, as well as to various redundant SAR ADC architectures (e.g., sub-binary/sub-radix).

And it will further be understood in view of the foregoing that in some embodiments of the present disclosure, an image sensor, such as a CMOS image sensor, comprises (i) an array of pixels, and (ii) an analog-to-digital converter (ADC) that is configured for converting an analog pixel signal corresponding to photocarriers integrated by a selected pixel of the pixel array into an N-bit digital signal, by at least (a) performing a coarse conversion on a readout of the selected pixel to determine m most-significant bits (m<N) of the N-bit digital signal, wherein the coarse conversion is initiated before the analog pixel signal settles to within N-bit resolution, and (b) after the analog pixel signal settles to within N-bit resolution, performing a fine conversion on the readout of the selected pixel to determine the n least-significant bits (n+m≥N).

Consonant with the illustrative embodiments disclosed with reference to FIGS. 1 and 2, those skilled in the art will understand that coarse and fine conversions may provide one, or more than one, overlapping or redundant bits. For example, if N-bit resolution (e.g., 12 bit resolution) is desired, one or more of the least significant bits of the coarse conversion may overlap with one or more of the most significant bits of the fine conversion, such that the coarse an fine conversions provide more than N bits (e.g., m may equal 3, and n may equal 10, as per the illustrative embodiment of FIGS. 1 and 2). Such redundant bit(s) may be used, for example, in post-processing to provide the N bits.

It will be understood from the foregoing, that myriad variations and additional or alternative embodiments may be implemented without departing from the scope of the present disclosure. The present invention has been illustrated and described with respect to specific embodiments thereof, which embodiments are merely illustrative of the principles of some embodiments of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. Similarly, the structure and/or function of a component may be combined into a single component or divided among two or more components. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with claims that are based on the present disclosure, as such claims may be presented herein and/or in any patent applications claiming priority to, based on, and/or corresponding to the present disclosure.

What is claimed is:

1. An image sensor comprising:
   an array of pixels; and
   at least one analog-to-digital converter (ADC) configured for converting an analog pixel signal corresponding to photocarriers accumulated by a given selected pixel of the pixel array into an N bit digital signal, each said at least one analog-to-digital converter comprising:
   an input configured to sample the analog pixel signal;
   conversion circuitry configured (i) to begin analog-to-digital conversion of the analog pixel signal at said input prior to the analog pixel signal settling to within N-bit resolution, and (ii) to correct the analog-to-digital conversion for error caused by the analog-to-digital conversion beginning prior to the analog pixel signal at said input settling, such that the analog-to-digital conversion provides an output digital signal that accurately represents the analog pixel signal within N-bit resolution.

2. The image sensor according to claim 1, wherein the conversion circuitry comprises (i) coarse conversion circuitry to determine m most-significant bits (m<N) of the N bit digital signal, and (ii) fine conversion circuitry to determine n least-significant bits (n+m≥N) and to correct for any error in at least one of the m most-significant bits.

3. The image sensor according to claim 2, wherein the coarse and fine conversions provide at least one overlapping or redundant bit, such that n+m>N.

4. The image sensor according to claim 2, wherein the ADC is a hybrid ADC, the coarse conversion comprises a SAR ADC, and the fine conversion circuitry comprises a ramp ADC.

5. The image sensor according to claim 1, wherein the ADC comprises a redundant SAR ADC.

6. The image sensor according to claim 4, wherein the redundant SAR ADC comprises a binary-weighted capacitor bank and includes at least one redundant capacitor.

7. The image sensor according to claim 1, wherein each pixel comprises a transfer gate operable to selectively cause intrapixel transfer of accumulated photocarriers from a charge accumulation node to a charge storage node, and wherein the conversion circuitry is configured to begin analog-to-digital conversion of the analog pixel signal during intrapixel transfer of accumulated photocarriers to the charge storage node, while the transfer gate is asserted to cause the intrapixel transfer.

8. The image sensor according to claim 6, wherein the charge accumulation node is a region of a pinned photodiode, and the charge storage region comprises a floating diffusion.

9. A method for conversion of an analog pixel signal read out of an image sensor pixel into a digital value of N-bit resolution, the method comprising:

initiating conversion of the analog pixel signal read out of the pixel to generate at least one digital value before the analog pixel signal settles to within N-bit resolution; and completing conversion of the analog pixel signal after the analog pixel signal settles to within N-bit resolution, to provide N bits representing the analog pixel signal, wherein settling error is compensated for based on redundancy in the conversion.

10. The method according to claim 9, wherein the method comprises:

performing a coarse conversion on the analog pixel signal before the analog pixel signal settles to within N-bit resolution, to determine m most-significant bits (m<N) of the N-bit digital signal; and after the analog pixel signal settles to within N-bit resolution, performing a fine conversion on the readout of the selected pixel to determine the n least-significant bits (n+m≥N).

11. The method according to claim 10, wherein the coarse conversion is performed by a SAR A/D converter.

12. The method according to claim 11, wherein the fine conversion is performed by a ramp A/D converter.

13. The method according to claim 12, wherein the SAR A/D converter and the ramp A/D converter are configured as a hybrid A/D converter comprising common control circuitry and a common comparator circuit.

14. The method according to claim 10, wherein m is at least three and n is at least 8.

15. The method according to claim 9, wherein the conversion is performed by a redundant SAR ADC.

16. The method according to claim 15, wherein the redundant SAR ADC comprises a binary-weighted capacitor bank and includes at least one redundant capacitor.

17. An image sensor comprising an A/D converter circuit that is configured to execute the method according to claim 9.

* * * * *